United States Patent
Pukkila et al.

(10) Patent No.: US 6,980,591 B2
(45) Date of Patent: Dec. 27, 2005

(54) ADAPTIVE METHOD AND ARRANGEMENT FOR IMPLEMENTING INCREMENTAL REDUNDANCY IN RECEPTION

(75) Inventors: Markku Pukkila, Espoo (FI); Hannu Vilpponen, Helsinki (FI)

(73) Assignee: Nokia Mobile Phones, Ltd., Espoo (FI)

( * ) Notice: Subject to any disclaimer, the term of this patent is extended or adjusted under 35 U.S.C. 154(b) by 644 days.

(21) Appl. No.: 09/790,468

(22) Filed: Feb. 22, 2001

(65) Prior Publication Data

US 2001/0017904 A1 Aug. 30, 2001

(30) Foreign Application Priority Data

Feb. 25, 2000 (FI) .................................. 20000443

(51) Int. Cl.[7] .............................................. H03H 7/40
(52) U.S. Cl. ...................... 375/229; 375/232; 375/340; 375/346; 714/758; 714/774
(58) Field of Search ................................ 375/140, 232, 375/340, 348, 224, 253, 254, 262, 265, 285, 375/341, 346, 229; 714/746, 758, 751, 774, 714/748, 750, 794, 795; 370/360

(56) References Cited

U.S. PATENT DOCUMENTS

| | | | |
|---|---|---|---|
| 5,694,404 A | 12/1997 | Huang | 371/35 |
| 6,182,261 B1 * | 1/2001 | Haller et al. | 714/758 |
| 6,266,360 B1 * | 7/2001 | Okamoto | 375/140 |
| 6,658,071 B1 * | 12/2003 | Cheng | 375/348 |

FOREIGN PATENT DOCUMENTS

WO WO 00/27037 5/2000

OTHER PUBLICATIONS

"Turbo-Detection: A New Approach To Combat Channel Frequency Selectivity", Picart et al., ICC 97.
"Iterative Equalization And Decoding For The GSM System", Bauch et al., Vehicular Technology Conference (VTC), IEEE 1998.

* cited by examiner

*Primary Examiner*—Young T. Tse
*Assistant Examiner*—Edith Chang
(74) *Attorney, Agent, or Firm*—Perman & Green, LLP.

(57) ABSTRACT

A method and an arrangement are presented for processing received data blocks in a digital radio receiver. Received data blocks are equalized (306) and channel decoded, (309) after which they are checked (310) for errors. Additionally there is monitored (303) the amount of received but not yet equalized and channel decoded data. As a response to a finding indicating that an equalized and channel decoded data block contains errors (310), it is checked (313) whether the amount of received but not yet equalized and channel decoded data is below a certain threshold. As a response to a finding indicating that the amount of received but not yet equalized and channel decoded data is below said threshold, the data block which was found to contain errors is iteratively equalized and channel decoded. By adaptively allowing iterative equalization and channel decoding, retransmissions may be avoided.

12 Claims, 2 Drawing Sheets

ADAPTIVE METHOD AND ARRANGEMENT FOR IMPLEMENTING INCREMENTAL REDUNDANCY IN RECEPTION

TECHNOLOGICAL FIELD

The invention relates in general to the technology of enhancing the possibilities of a digital wireless receiver to correctly reconstruct the information content of a received block of data. Especially the invention relates to the technology of only adaptively providing incremental redundancy to the received block of data to enable the reconstruction of its information content.

BACKGROUND OF THE INVENTION

Many digital radio systems employ a sophisticated arrangement of acknowledgements and retransmissions to enable the receiver to correctly reconstruct the information content of each received data block. This is especially the case in packet switched radio connections used to convey non-real time services, because the nonpredictable need for retransmissions is ill suited for the tight timing requirements of real time services. A retransmission means that in some way or another the receiver makes the transmitter aware of that a block of data was not received in a good enough shape, so the transmitter must transmit at least a part thereof again.

Retransmitting the same piece of data several times consumes transmission time and bandwidth, which are scarce in multiple user systems like cellular radio networks. Incremental redundancy in general means that the transmitter tries to find and transmit the smallest possible portion of the previously transmitted information that would be enough for the receiver to perform its task of reconstructing the information content. Many known incremental redundancy schemes rely on the fact that the first version of the transmitted data block is punctured, i.e. a predefined pattern of bits thereof are intentionally omitted at the transmission stage. If the conditions of reception are good, the receiver is able to use the remaining parts of the data block to bridge the punctured gaps. If the first decoding round is unsuccessful, the receiver asks the transmitter to additionally give a number of the originally punctured bits.

Also incremental redundancy arrangements have their drawbacks. Even if the limited retransmissions are much smaller in bit number than completely retransmitted blocks, they still consume radio resources. The concept of retransmissions, be they complete or partial, inherently introduces delay because the receiver must react to an unsuccessful decoding attempt and find a scheduled turn for asking for the retransmission, and the transmitter must receive and decode the request and react thereto as well as wait for the next suitable time instant for transmitting the requested additional bits.

SUMMARY OF THE INVENTION

It is an object of the present invention to provide a method and an arrangement for efficiently using the transmission and reception resources in a radio system where retransmission is possible.

The objects of the invention are achieved by equipping the receiver with a reception buffer, an iterative decoder and a decision element which is arranged to consider the filling ratio of the reception buffer in deciding, whether to iterate on an already received amount of data or to ask for a retransmission.

The method according to the invention is characterized in that it comprises the steps of:

monitoring the amount of received but not yet equalized and channel decoded data, as a response to a finding indicating that an equalized and channel decoded data block contains errors, checking whether the amount of received but not yet equalized and channel decoded data is below a certain threshold and as a response to a finding indicating that the amount of received but not yet equalized and channel decoded data is below said threshold, iteratively equalizing and channel decoding the data block which was found to contain errors.

The invention applies also to a radio receiver comprising, in a receiver chain, a series coupling of an equalizer, a channel decoder and an error detector; it is characterized in that it comprises a decision element coupled to said error detector, which decision element is arranged to monitor the amount of received but not yet equalized and channel decoded data, as a response to the error detector indicating that an equalized and channel decoded data block contains errors, check whether the amount of received but not yet equalized and channel decoded data is below a certain threshold and as a response to a finding indicating that the amount of received but not yet equalized and channel decoded data is below said threshold, initiate iterative equalization and channel decoding of the data block which was found to contain errors.

The concept of iterative equalization and decoding is known as such from e.g. A. Picart, P. Didier and A. Glavieux: "Turbo-Detection: A new approach to combat channel frequency selectivity", ICC 97, or G. Bauch and V. Franz: "Iterative Equalization and Decoding for the GSM System" in Vehicular Technology Conference (VTC), IEEE, May 1998; these publications are incorporated herein by reference. Iterative equalization and decoding means that decoding decisions from a certain decoding round are fed back as a kind of a priori information into a new signal processing round where the same block of digital data is equalized and decoded anew.

According to the invention, received digital data is temporarily stored in a reception buffer. A block of data obtained from the buffer is equalized and decoded; a deinterleaving step is also needed if interleaving was used in the transmitting end to distribute originally adjacent bits according to some interleaving scheme. After decoding the receiver calculates a checksum or uses some other feature of the decoded data to examine, whether or not it contains errors. If errors are found, a decision element in the receiver has the possibility of obtaining decoding decisions from the decoder and feeding them back to the equalizer for an iterative equalization and decoding round. In making the decision the decision element considers the filling ratio of the reception buffer to determine, whether enough time remains for the iterative equalization and decoding round to be performed. If the reception buffer appears to fill over a certain limit, the decision element disables further iterative decoding of the same data block and asks for a retransmission instead or declares the data block invalid if retransmissions are not possible.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE INVENTION

Figure 1:
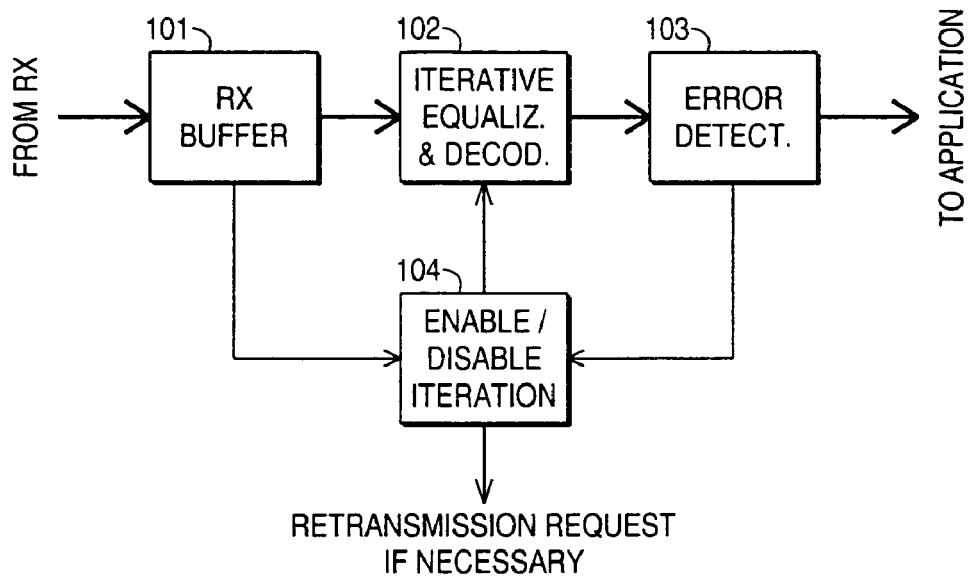
FIG. 1 illustrates a signal processing principle according to an embodiment of the invention.

FIG. 1 illustrates a signal processing principle where a received signal is directed into a buffer memory 101 for temporary storage. An independently decodable piece of the stored signal, designated here as a block, is taken into an equalizer and channel decoder unit 102 which is capable of iterative equalization and decoding. A first pass through unit 102 does not involve iteration, in the hope that already the first equalization and decoding attempt will result in an error-free block of decoded digital information. In order to check for the occurrence of errors, the output of the equalizer and channel decoder unit 102 is taken into an error detecting unit 103. The latter may be e.g. a known CRC (Cyclic Redundancy Check) checksum calculator which calculates a checksum and compares it against a corresponding checksum value included within the block of received data. If the block of decoded digital information is found to contain no errors, it can be passed on to the application to the use of which it was intended.

However, there is a monitoring unit 104 which is coupled both to the buffer memory 101 to keep up with the filling ratio thereof and to the error detecting unit 103 to find out if the decoded block of digital data was found to contain errors. If the monitoring unit 104 learns from the error detecting unit that the decoded block of digital data contained errors, it checks the current filling situation of the buffer memory 101. If the buffer memory 101 is empty or nearly empty, there is enough time for at least one iteration round in unit 102 before a new block of received data has to be read in from the buffer memory 101. In such a case the monitoring unit instructs the equalizer and channel decoder unit 102 to take the previously obtained decoding decisions (or a subset thereof, according to some suitable principle of iterative equalization and decoding) as "a priori" information to the input of the equalizer stage and to perform a new round of equalization and channel decoding.

In a situation where errors are detected by unit 103 it may also happen that the buffer memory 101 is found to be filled up to a predetermined limit. In such a case an attempt to iteratively equalize and decode a previously received block of data would cause an unacceptable delay of reading the next block from the buffer memory 101, so further iterations on the previously received block must be disabled. In order to facilitate the correction of errors the monitoring unit 104 may initiate a retransmission request concerning the block which the receiver was unable to equalize and decode correctly.

Figure 2:
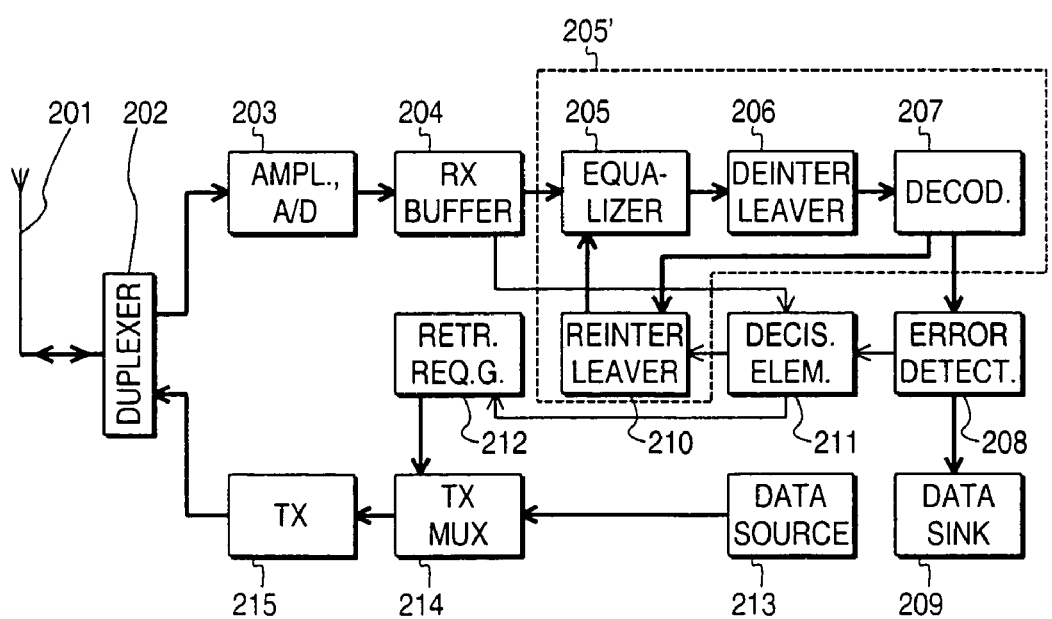
FIG. 2 illustrates a radio transceiver according to an embodiment of the invention and FIG. 3 illustrates a method according to an embodiment of the invention.

FIG. 2 illustrates a radio transceiver according to an embodiment of the invention. An antenna 201 is coupled to a duplexer 202 for separating received signals from signals to be transmitted. The reception branch output of the duplexer 202 is coupled to a receiver block 203 which comprises, in a way known as such, components like amplifiers, filters and A/D converters. The output of the receiver block 203 consists of digital samples that represent a received signal in an unequalized and undecoded form.

The output of the receiver block 203 is coupled to the input of a FIFO-type (First In-First Out) reception buffer 204 which is capable of storing a certain number of samples at a time. We will analyze the optimal dimensioning of the buffer 204 in more detail later. The buffer 204 comprises also a control output from which the filling ratio of the buffer can be read. The data output of the buffer 204 is coupled to an equalizer 205, from which the path of received data continues through a deinterleaver 206, a decoder 207 and error detection unit 208 to a data sink 209. From the decoder 207 there is also an output to a reinterleaver 210 which in turn is coupled to an additional input in the equalizer 205. Together the loop consisting of the equalizer, the deinterleaver 206, the decoder 207 and the feedback connection from the latter through the reinterleaver 210 to the equalizer 205 constitutes a so-called turbo equalizer 205'.

There are control connections from the error detection unit 208 and the reception buffer 204 to a decision element 211 from which there are control outputs to the reinterleaver 210 and a retransmission request generator 212. In the transmitter side of the transceiver in FIG. 2 there is a data source 213 which, together with the retransmission request generator 212, is coupled through a transmission multiplexer 214 to a transmitter block 215 which includes, in a manner known as such, the necessary means for transforming a digital bitstream into modulated radio frequency oscillations. The output of the transmitter block 215 is coupled to the transmission branch input of the duplexer 202.

Figure 3:
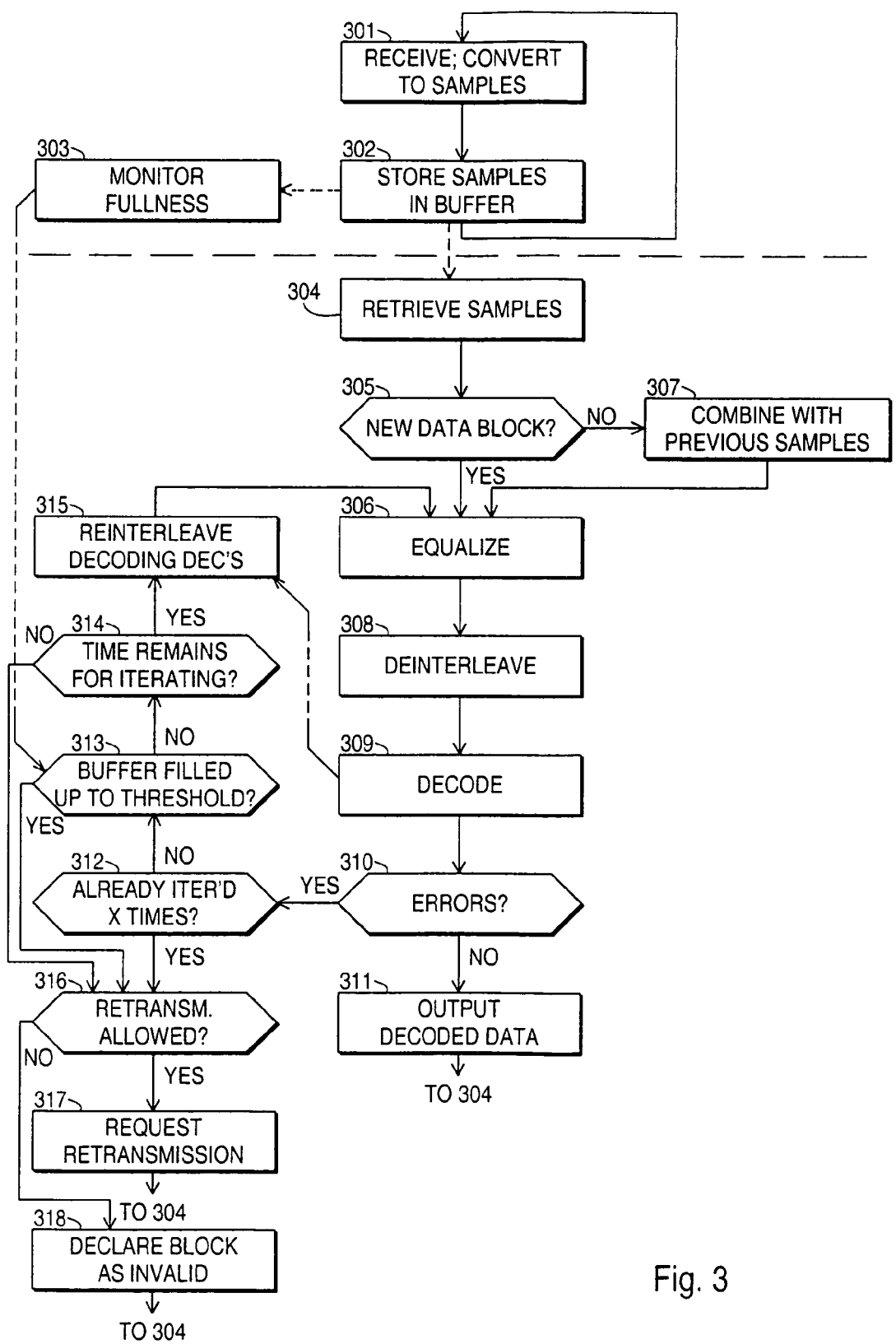

FIG. 3 illustrates an exemplary method of operation for the radio transceiver of FIG. 2. The reception of radio signals and their conversion into stored digital samples takes place in the loop consisting of steps 301 and 302. The time schedule of circulating this reception loop is dictated by the transmission schedule employed in the radio system in question, so conceptually the reception loop may be regarded almost as separated from the signal processing operations that aim at equalizing and decoding the received signals. The RX buffer memory 204 in FIG. 2 serves as the means for exchanging information between the reception loop and the equalization and channel decoding processes. The step of monitoring the filling ratio of the buffer memory is shown as step 303 in FIG. 3.

At step 304 a group of samples are read from the RX buffer memory. In the most often encountered case the samples are those that represent a new block of data to be equalized and channel decoded. However, at step 305 it is checked whether that is the case or whether the samples are complementary samples to some previously processed block the equalization and channel decoding of which was found to be impossible without a retransmission. The samples of a newly read block are passed on to an equalization step 306, whereas complementary samples to some previous block are combined with the previous samples of that block in step 307. The invention does not limit the selection of combination strategy: indeed in some cases it may be better to ask for a complete retransmission of a seriously defective data block in which case step 307 means that the whole previous sample group representing the defective block is replaced with fresh new samples.

An equalization, deinterleaving and decoding round consists of steps 306, 308 and 309. At step 310 the channel decoded block from step 309 is checked for errors. In the optimal case no errors are found, so the block may be output at step 311, after which the receiver returns to step 304 (note that the loop consisting of steps 301 and 302 has been independently running all the time). If errors are found at step 310, there follows at step 312 a check for the number of already performed iteration rounds on the same data. Iterative equalization and decoding procedures have a tendency to converge towards a certain final result after a relatively small number of iteration rounds, so it may be advantageous to set a limit for the allowed number of iteration rounds.

The requirement of no errors can be somewhat generalized by stating that the detected erroneousness of the equalized and channel decoded data block must be below a certain threshold.

Taken that the number of already performed iteration rounds is found to be within limits at step 312, the receiver checks at steps 313 the current filling ratio of the RX buffer. Even if the buffer is not filled up to the threshold of disabling further iterations, it may be advantageous to check for other existing timing constraints; this is done at step 314. Only after a positive decision at step 314 the receiver enables the reinterleaving of the most recently obtained decoding decisions at step 315. The results are then fed as a priori information to a further equalization and decoding round starting at step 306.

If it is found at step 312 that the number of allowed iteration rounds has been reached, or if the reception buffer is found to be full enough at step 313, or if some other timing constraint is found to apply at step 314, there follows a transition to step 316 where the receiver checks, whether retransmissions are allowable. The allowability of retransmissions is usually a characteristic of the radio bearer which is used to convey the blocks of digital data. If retransmissions are allowed, a retransmission request is initiated at step 317. Otherwise the block which was found to be erroneous is declared as invalid at step 318. In any case the receiver returns to step 304 in order to continue the processing of received information.

The selection of decision criteria shown as steps 312, 313 and 314 may be simplified from that shown in FIG. 3. For example, the receiver may rely completely on monitoring the filling ratio of the reception buffer and omit any additional checks of allowed number of iterations or remaining time. Alternatively the check of remaining time may be used as the single decision criterion, especially if the transmission rate is known to be constant so that the time elapsed since the moment of reading a certain block from the reception buffer is known to unequivocally correspond to the filling ratio of the reception buffer. Even the maximum number of iterations may serve as the sole criterion for decisions, if it can be guaranteed that the receiver is always able to perform the maximum number of iterations in less than a predetermined maximum time.

However, also other decision criteria can be applied: for example if the error detection arrangement allows detecting the number of errors, the receiver may check, whether a certain iteration round produced any reduction in that number. If the number of errors stays the same despite of consecutive iterations, it is not worth the effort to iterate any more even if timing or other constraints would allow additional iteration rounds.

The form in which the decoding decisions are fed back through reinterleaving to the equalization process is worth some consideration. At the error detection stage the original block of multiple-valued digital samples must have been converted to so-called hard decisions, meaning that the value of each bit may be only exactly 0 or exactly 1. However, up to the very last stages of channel decoding the principle of soft decisions may be applied, where each bit value is represented by a mere probability of it being either 0 or 1. The invention does not dictate whether soft or hard decisions are fed back into the iterative equalization and channel decoding process, although in many cases better results are obtained by feeding back the soft decisions.

In the foregoing we have not given a precise definition of what should be regarded as a critical threshold for the filling ratio of the receiving buffer. The invention does not call for a specific definition, because the criticality of the filling ratio depends both on the processing capability of the equalization and channel decoding loop as well as on the maximum allowable overall delay in processing received packets: if the equalization and channel decoding loop is very fast, a relatively large portion of the following data block may be allowed to accumulate into the buffer, and if delay is not a problem, even several data blocks may be waiting in the buffer while the equalization and channel decoding loop is trying to reconstruct a particularly badly corrupted data block. In practical communication situations, especially within the framework of the so-called third generation digital cellular networks, it may well be that every radio bearer has its own individually defined delay limits, so it is advantageous to make the critical threshold for the filling ratio of the receiving buffer dynamically changeable. To give an estimate, with the technology of the priority date of the present patent application it is believed that if no more than one fourth of a new data block is allowed to accumulate into the receiving buffer before disabling further iteration on the previous data block, the method according to the invention would not cause additional delay to the continuous reception and processing of data blocks.

A multitude of known methods exist for monitoring the filling ratio of a buffer memory. The invention does not limit the selection of such method.

The features of the invention that are presented in the depending patent claims are freely combinable unless otherwise explicitly stated.

What is claimed is:

1. A method for processing received data blocks in a digital radio receiver, comprising the steps of:
   equalizing and channel decoding a received data block;
   checking the equalized and channel decoded received data block for errors;
   monitoring an amount of received but not yet equalized and channel decoded data and measuring a time passed since the beginning of the equalizing and channel decoding of the equalized and channel decoded received data block; and
   as a response to a finding indicating that the equalized and channel decoded received data block contains errors, checking whether the amount of received but not yet equalized and channel decoded data is below a certain threshold; and
   as a response to a finding indicating that the amount of received but not yet equalized and channel decoded data is below said certain threshold, iteratively equalizing and channel decoding the equalized and channel decoded received data block which was found to contain errors.

2. A method according to claim 1, comprising the step of temporarily storing data belonging to the received data blocks in a buffer memory prior to the equalizing and channel decoding, so that the step of monitoring the amount of received but not yet equalized and channel decoded data comprises the substep of monitoring a filling ratio of said buffer memory.

3. A method according to claim 1, wherein the step of iteratively equalizing and channel decoding the equalized and channel decoded received data block which was found to contain errors comprises the substeps of:
   after each iterative round of equalizing and channel decoding, checking the iteratively equalized and channel decoded received data block for errors and
   as a response to a finding indicating that the detected erroneousness of the iteratively equalized and channel decoded data block is below a certain threshold, disabling further iteration rounds on the equalized and channel decoded received data block.

4. A method according to claim 3, wherein the step of iteratively equalizing and channel decoding the equalized and channel decoded received data block which was found to contain errors additionally comprises the substeps of:
   calculating the number of iterative rounds of equalizing and channel decoding the equalized and channel decoded received data block and
   as a response to the number of iterative rounds of equalizing and channel decoding reaching a certain limit, disabling further iteration rounds on the equalized and channel decoded received data block.

5. A method according to claim 3, wherein the step of iteratively equalizing and channel decoding the equalized and channel decoded received data block which was found to contain errors additionally comprises the substeps of:
   after each iterative round of equalizing and channel decoding, checking whether a time constraint allows further iteration and
   as a response to a finding indicating that said time constraint does not allow further iteration, disabling further iteration rounds on the equalized and channel decoded received data block.

6. A method according to claim 3, comprising the steps of:
   examining, whether retransmissions are allowed for the equalized and channel decoded received data blocks for which the detected erroneousness is not below said certain threshold, and
   as a response to a finding indicating that retransmissions are allowed, initiating a request for retransmission concerning the equalized and channel decoded received a data blocks for which the detected erroneousness was found not to be below said certain threshold.

7. A method according to claim 1, comprising the step of deinterleaving the received block of data between equalizing and channel decoding, so that the step of iteratively equalizing and channel decoding the received data block which was found to contain errors comprises the substep of reinterleaving those parts of the received data block which are fed back to the equalizing as a part of the iteration.

8. A radio receiver comprising:
   in a receiver chain, a series coupling of an equalizer, a channel decoder and an error detector; and
   a decision element coupled to said error detector;
   wherein said decision element is arranged to
   monitor an amount of received but not yet equalized and channel decoded data and measuring a time passed since the beginning of the equalizing and channel decoding of an equalized and channel decoded data block; and
   as a response to said error detector indicating that the equalized and channel decoded data block contains errors, check whether the amount of received but not yet equalized and channel decoded data is below a certain threshold; and
   as a response to a finding indicating that the amount of received but not yet equalized and channel decoded data is below said certain threshold, initiate iterative equalization and channel decoding of the equalized and channel decoded received data block which was found to contain errors.

9. A radio receiver according to claim 8, comprising, prior to the equalizer in a propagation direction of received signals, a buffer memory, so that said decision element is arranged to monitor the filling ratio of said buffer memory.

10. A radio receiver according to claim 8, additionally comprising:
    a deinterleaver coupled between the equalizer and the channel decoder for deinterleaving equalized but not channel decoded data, and
    a reinterleaver coupled between the channel decoder and the equalizer for reinterleaving channel decoded data which is to be fed as a priori information to an iterative round of equalizing and channel decoding.

11. A mobile station comprising:
    a radio receiver in a receiver chain including a series coupling of an equalizer and a channel decoder for equalizing and channel decoding a received data block and an error detector for checking the equalized and channel decoded received data block for errors;
    a decision element coupled to the error detector that is adapted to monitor an amount of received but not yet equalized and channel decoded data and measure a time passed since the beginning of the equalizing and channel decoding of the equalized and channel decoded received data block; and
    as a response to the error detector indicating that the equalized and channel decoded received data block contains errors, check whether the amount of received but not yet equalized and channel decoded data is below a certain threshold; and
    as a response to a finding indicating that the amount of received but not yet equalized and channel decoded data is below said certain threshold, initiate iterative equalizing and channel decoding of the equalized and channel decoded received data block which was found to contain errors.

12. A system for processing received data blocks in a digital radio receiver comprising:
    an equalizer and a channel decoder for equalizing and channel decoding a received data block;
    an error detector for checking the equalized and channel decoded received data block for errors;
    a decision element coupled to the error detector for monitoring the amount of received but not yet equalized and channel decoded data and measuring a time passed since the beginning of the equalizing and channel decoding of the currently equalized and channel decoded received data block; and as a response to the error detector indicating that the equalized and channel decoded data block contains errors, check whether the amount of received but not yet equalized and channel decoded data is below a certain threshold; and as a response to a finding indicating that the amount of received but not yet equalized and channel decoded data is below said certain threshold, initiate iterative equalizing and channel decoding of the equalized and channel decoded received data block which was found to contain errors.

* * * * *